US00RE50146E

(19) United States
(12) Reissued Patent
Moon et al.

(10) Patent Number: US RE50,146 E
(45) Date of Reissued Patent: Sep. 24, 2024

(54) LIGHT EMITTING DIODE CHIP AND LIGHT EMITTING DIODE DISPLAY APPARATUS COMPRISING THE SAME

(71) Applicant: LG DISPLAY CO., LTD., Seoul (KR)

(72) Inventors: JinSu Moon, Paju-si (KR); Wonseok Choi, Paju-si (KR)

(73) Assignee: LG DISPLAY CO., LTD., Seoul (KR)

(21) Appl. No.: 17/869,553

(22) Filed: Jul. 20, 2022

Related U.S. Patent Documents

Reissue of:
(64) Patent No.: 10,720,558
Issued: Jul. 21, 2020
Appl. No.: 15/846,563
Filed: Dec. 19, 2017

(30) Foreign Application Priority Data

Dec. 20, 2016 (KR) ..... 10-2016-0174731

(51) Int. Cl.
*H01L 25/075* (2006.01)
*H01L 27/12* (2006.01)
*H01L 27/15* (2006.01)
*H01L 33/36* (2010.01)
(Continued)

(52) U.S. Cl.
CPC ..... *H01L 33/62* (2013.01); *H01L 25/0753* (2013.01); *H01L 27/1248* (2013.01); *H01L 27/15* (2013.01); *H01L 33/36* (2013.01); *H01L 27/1214* (2013.01); *H01L 33/0095* (2013.01)

(58) Field of Classification Search
CPC ..... H01L 25/0753; H01L 27/15; H01L 33/36; H01L 33/62; H01L 27/1248; H01L 33/0095; H01L 27/1214
See application file for complete search history.

(56) References Cited

U.S. PATENT DOCUMENTS 7,567,317 B2 7/2009 Tanaka et al.
2006/0171135 A1 8/2006 Ishizaka et al.
(Continued)

FOREIGN PATENT DOCUMENTS

CN 104952899 A 9/2015
JP 2001085740 A 3/2001
(Continued)

OTHER PUBLICATIONS

Translation of JP-2003309293 (Year: 2003).*
(Continued)

*Primary Examiner* — Ling X Xu
(74) *Attorney, Agent, or Firm* — POLSINELLI PC

(57) ABSTRACT

A light emitting diode chip and a light emitting diode display apparatus comprising the same, are disclosed in which a screen defect caused by a defect of the light emitting diode chip is minimized. The light emitting diode chip comprises a semiconductor substrate; first and second light emitting diodes provided on the semiconductor substrate in parallel with each other while having first and second pads; a first electrode commonly connected to the first pad of each of the first and second light emitting diodes; and a second electrode commonly connected to the second pad of each of the first and second light emitting diodes, wherein the first and second light emitting diodes are electrically connected to each other in parallel.

50 Claims, 5 Drawing Sheets

(51) Int. Cl.
*H01L 33/62* (2010.01)
*H01L 33/00* (2010.01)

(56) References Cited

U.S. PATENT DOCUMENTS

2006/0284195 A1* 12/2006 Nagai ..... H01L 33/387 257/E33.068
2007/0069220 A1* 3/2007 Ogihara ..... H01L 25/0753 257/79
2007/0085944 A1* 4/2007 Tanaka ..... G02F 1/133603 349/69
2008/0211416 A1* 9/2008 Negley ..... H05B 33/0803 315/193
2008/0258695 A1* 10/2008 Kumar ..... H05B 33/0818 323/223
2011/0121329 A1* 5/2011 Chen ..... H01L 25/0753 257/91
2011/0140078 A1* 6/2011 Hsu ..... H01L 25/0753 257/E33.068
2013/0154478 A1* 6/2013 Ohe ..... H05B 33/02 257/40
2013/0234624 A1 9/2013 Omoto ..... H10K 59/121 315/312
2014/0267683 A1 9/2014 Bibl et al.
2014/0306200 A1* 10/2014 Jinta ..... H10K 59/353 257/40
2014/0367705 A1 12/2014 Bibl et al.
2014/0367711 A1 12/2014 Bibi et al.
2015/0255438 A1* 9/2015 Oraw ..... H01L 25/0753 257/89
2016/0372514 A1 12/2016 Chang et al.
2017/0352834 A1* 12/2017 Kim ..... G02F 1/133305

FOREIGN PATENT DOCUMENTS

JP 2003-309293 A 10/2003
JP 2006339541 A 12/2006
JP 2007140453 A 6/2007
JP 2013-186448 A 9/2013
JP 2016-522585 A 7/2016
JP 2003309293 * 10/2023 ..... H01L 33/00
WO 2008/091837 A2 7/2008

OTHER PUBLICATIONS

Office Action dated Mar. 18, 2019 issued in the corresponding Japanese Patent Application No. 2017-242779, pp. 1-2.
Office Action dated Oct. 17, 2018 issued in the corresponding Japanese Patent Application No. 2017-242779, pp. 1-2.

* cited by examiner

LIGHT EMITTING DIODE CHIP AND LIGHT EMITTING DIODE DISPLAY APPARATUS COMPRISING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATION

This application claims the benefit of the Korean Patent Application No. 10-2016-0174731 filed on Dec. 20, 2016, which is hereby incorporated by reference in its entirety for all purposes as if fully set forth herein.

BACKGROUND OF THE DISCLOSURE

Field of the Disclosure

The present disclosure relates to a display device, and more particularly, to a light emitting diode chip and a light emitting diode display apparatus comprising the same.

Description of the Background

A display device is widely used as a display screen for a notebook computer, a tablet computer, a smart phone, a portable display device, and a portable information device, in addition to a display screen for a television and a monitor.

A liquid crystal display device and an organic light emitting display device are switching devices, and display an image by using a thin film transistor. Since the liquid crystal display device is not a self-emitting device, the liquid crystal display device displays an image by using light irradiated from a backlight unit arranged under a liquid crystal display panel. Since the liquid crystal display device requires a backlight unit, there is a restriction in design, and it can deteriorates luminance and response speed. Since the organic light emitting display device includes an organic matter, it is vulnerable to moisture, thereby deteriorating reliability and lifespan.

Recently, a light emitting diode display apparatus based on a micro light emitting diode chip has been studied and developed. Since this light emitting diode display apparatus has high picture quality and high reliability, the light emitting diode display apparatus has received much attention as a next generation display.

However, in the light emitting diode display apparatus of the related art, a screen defect occurs due to a defect a micro light emitting diode chip or a transfer defect during a process of packaging the micro light emitting diode chip in a thin film transistor array substrate. A problem occurs in cost and technical level if the defect is repaired directly on the thin film transistor array substrate. And, a redundancy mode has a problem in that a transfer time is increased twice or more.

SUMMARY

Accordingly, the present disclosure is directed to a light emitting diode chip and a light emitting diode display apparatus comprising the same, which substantially obviate one or more problems due to limitations and disadvantages of the related art.

An advantage of the present disclosure is to provide a light emitting diode chip and a light emitting diode display apparatus comprising the same, in which a screen defect caused by a defect of the light emitting diode chip is minimized.

Additional advantages and features of the disclosure will be set forth in part in the description, which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these features and other advantages and in accordance with the purpose of the disclosure, as embodied and broadly described herein, a light emitting diode chip according to the present disclosure comprises a semiconductor substrate; first and second light emitting diodes provided on the semiconductor substrate in parallel with each other while having first and second pads; a first electrode commonly connected to the first pad of each of the first and second light emitting diodes; and a second electrode commonly connected to the second pad of each of the first and second light emitting diodes, wherein the first and second light emitting diodes are electrically connected to each other in parallel.

In another aspect of the present disclosure, a light emitting diode display device comprises a first pixel including a first driving thin film transistor on a substrate; a planarization layer covering the first pixel and having a first recessed portion in the planarization layer; a first light emitting diode chip disposed in the first recessed portion of the planarization layer and including first and second light emitting diodes electrically connected with each other in parallel, each of the first and second light emitting diodes having first and second electrodes; a pixel electrode electrically connecting the driving thin film transistor and the first electrode of the first light emitting diode chip; and a common electrode electrically connected to the second electrode of the first light emitting diode chip.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
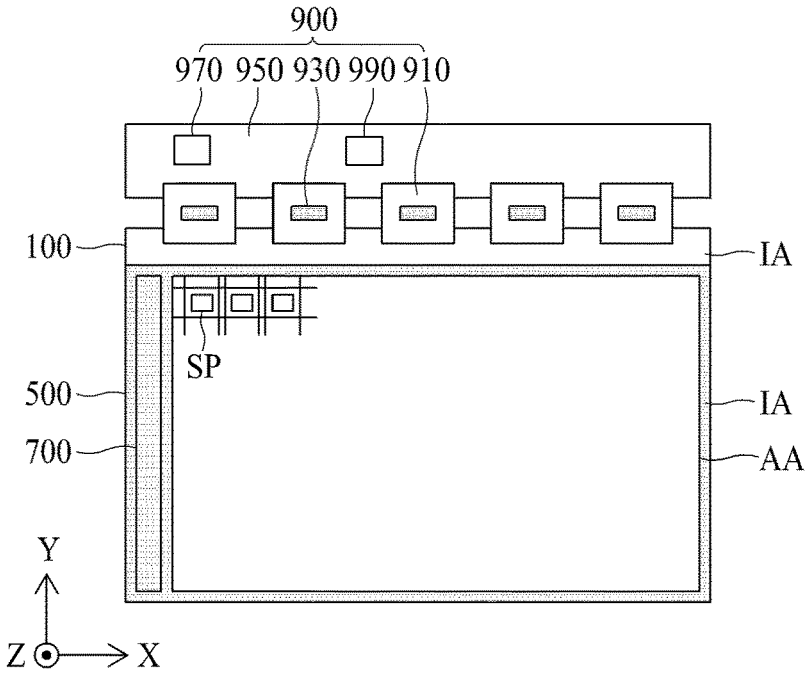
FIG. 1 is a view illustrating a configuration of a light emitting diode display apparatus according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

"First horizontal-axis direction", "second horizontal-axis direction" and "vertical-axis direction" should not be construed by a geometric relation only of a mutual vertical relation, and may have broader directionality within the range that elements of the present disclosure may act functionally.

It should be understood that the term "at least one" includes all combinations related with one or more items. For example, "at least one among a first item, a second item and a third item" may include all combinations of two or more items selected from the first, second and third items as well as each item of the first, second and third items.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the preferred aspects of a light emitting diode chip and a light emitting diode display apparatus comprising the same according to the present disclosure will be described in detail with reference to the accompanying drawings. In this specification, in adding reference numbers to elements of respective drawings, it is to be noted that the same reference elements have the same reference numbers if possible even though the same reference elements are shown on different drawings.

Figure 2:
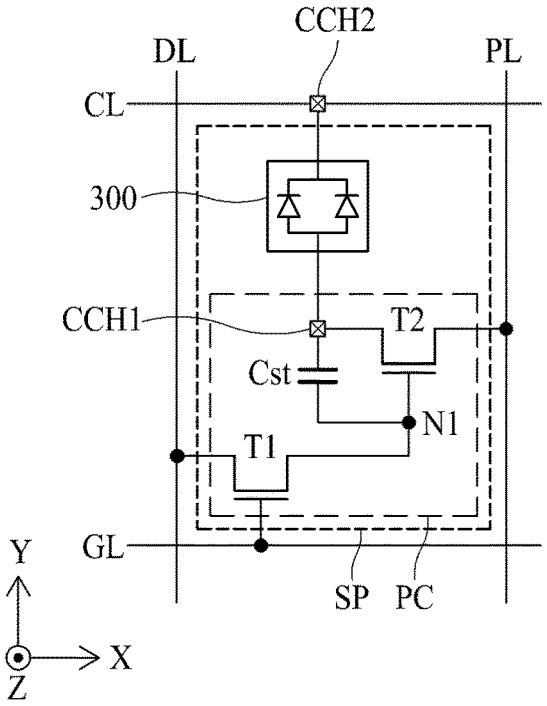
FIG. 2 is a circuit diagram illustrating a configuration of a pixel shown in FIG. 1.

FIG. 1 is a view illustrating a configuration of a light emitting diode display apparatus according to one aspect of the present disclosure, and FIG. 2 is a circuit diagram illustrating a configuration of a pixel SP shown in FIG. 1.

Referring to FIGS. 1 and 2, the light emitting diode display apparatus according to an aspect includes a first substrate 100, a plurality of light emitting diode chips 300, and a second substrate 500.

The first substrate 100 may be referred to as a thin film transistor array substrate, and may be made of a glass or plastic material. The first substrate 100 according to one example, includes a display area AA and a non-display area IA.

The display area AA is provided in the other portions except for an edge portion of the first substrate 100. The display area AA may be defined as an area where a pixel array for displaying an image is arranged.

The non-display area IA is provided in the other portion except the display area AA provided in the first substrate 100, and may be defined as an edge portion of the first substrate 100, which surrounds the display area AA. This non-display area IA is a peripheral area outside the display area AA, and an image is not displayed on this non-display area IA unlike the display area AA. The non-display area IA may be defined as an area where a line and a circuit for driving the pixel array are arranged. For example, the non-display area IA may have a first non-display area defined near an upper side of the display area AA, a second non-display area defined near a lower side of the display area AA, a third non-display area defined near a left side of the display area AA, and a fourth non-display area defined near a right side of the display area AA.

The first substrate 100 according to one example includes a plurality of gate lines GL, a plurality of data lines DL, a plurality of driving power lines PL, a plurality of common power lines CL, and a plurality of pixels SP.

Each of the plurality of gate lines GL is provided on the first substrate 100, longitudinally extended along a first horizontal-axis direction X of the substrate 100 and spaced apart from another gate line at a certain interval along a second horizontal-axis direction Y. In this case, the first horizontal-axis direction X may be defined in parallel with a long side length direction of the first substrate 100, and the second horizontal-axis direction Y may be defined in parallel with a short side length direction of the first substrate 100, or vice versa.

The plurality of data lines DL are provided on the first substrate 100 to cross the plurality of gate lines GL, longitudinally extended along the second horizontal-axis direction Y of the first substrate 100 and spaced apart from one another along the first horizontal-axis direction X.

The plurality of driving power lines PL are provided on the first substrate 100 to be respectively parallel with the plurality of data lines DL, and may be formed respectively together with the plurality of data lines DL. Each of the plurality of driving power lines PL supplies externally provided pixel driving power source to its adjacent pixel SP.

The plurality of driving power lines PL may be commonly connected to a first driving power common line provided in the first non-display area of the first substrate to be parallel with the gate lines GL. The first driving power common line serves to distribute the externally provided pixel driving power source to each of the plurality of driving power lines PL. The first driving power common line may be provided on the same layer as the gate lines GL to be electrically disconnected from each of the plurality of data lines DL, and may electrically be connected with an end of each of the plurality of driving power lines PL through a via hole.

Additionally, the pixel driving power source may be supplied to one end and the other end of each of the plurality of driving power lines PL. To this end, one end of each of the plurality of driving power lines PL is commonly connected to the first driving power common line provided in the non-display area of the first substrate 100, and the other end of each of the plurality of driving power lines PL is commonly connected to a second driving power common line provided in the second non-display area of the first substrate 100. In this case, in this aspect, the pixel driving power source is applied to each of the upper end and the lower end of each of the plurality of driving power lines PL through the first and second driving power common lines, whereby voltage drop of the driving power source generated each of the plurality of driving power lines PL in accordance with line resistance per position of each of the plurality of driving power lines PL may be minimized.

Each of the first and second driving power common lines may be provided on the same layer as the plurality of gate lines GL, and may electrically be connected with the end of each of the plurality of driving power lines PL through the via hole.

The plurality of common power lines CL are provided on the first substrate 100 to be respectively parallel with the plurality of gate lines GL, and may be formed respectively together with the plurality of gate lines GL. Each of the plurality of common power lines CL supplies externally provided common power to its adjacent pixel SP. Each of the plurality of common power lines CL may be supplied with a common power source from a panel driver 900. In this case, the panel driver 900 may compensate for electric characteristic change of a light emitting diode chip 300 and/or electric characteristic change of a driving thin film transistor, which will be described later, by individually controlling a voltage level of a common power source supplied to each of the plurality of common power lines CL.

Additionally, the plurality of common power lines CL may commonly connected to a common power supply line provided in at least one of the third and fourth non-display areas of the first substrate 100. The common power supply line serves to distribute the externally supplied power source to each of the plurality of common power lines CL. The common power supply line may be provided on the same layer as the data lines DL to be electrically disconnected from each of the plurality of gate lines GL, and may electrically be connected with the end of each of the plurality of common power lines CL through the via hole.

Each of the plurality of pixels SP is provided in a pixel area defined by the gate line GL and the data line DL. Each of the plurality of pixels SP is a minimum unit area emitting light, and may be defined as a sub pixel. At least three adjacent pixels SP may constitute one unit pixel for color display. For example, one unit pixel may include a red pixel, a green pixel and a blue pixel, which are adjacent to one another, and may further include a white pixel for improvement of luminance.

Each of the plurality of pixels SP includes a pixel circuit PC.

The pixel circuit PC is provided in a circuit area defined in the pixel SP, connected to its adjacent gate line GL, data line DL and driving power line PL, and connected to the light emitting diode chip 300. This pixel circuit PC controls a current flowing in the light emitting diode chip 300 in accordance with a data signal from the data line DL in response to a gate pulse from the gate line GL based on the pixel driving power source supplied from the driving power line PL. The pixel circuit PC according to one example includes a switching thin film transistor T1, a driving thin film transistor T2, and a capacitor Cst.

The switching thin film transistor T1 includes a gate electrode connected to the gate line GL, a first electrode connected to the data line DL, and a second electrode connected a gate electrode N1 of the driving thin film transistor T2. In this case, the first and second electrodes of the switching thin film transistor T1 may be a source electrode or a drain electrode in accordance with a direction of the current. This switching thin film transistor T1 is switched in accordance with a gate pulse supplied to the gate line GL, thereby supplying a data signal supplied to the data line DL to the driving thin film transistor T2.

The driving thin film transistor T2 is turned on by a voltage supplied from the switching thin film transistor T1 and/or a voltage of the capacitor Cst, thereby controlling the amount of the current flowing from the driving power line PL to the light emitting diode chip 300. To this end, the driving thin film transistor T2 according to one example includes a gate electrode connected to the second electrode N1 of the switching thin film transistor T1, a drain electrode connected to the driving power line PL, and a source electrode connected to the light emitting diode chip 300. The driving thin film transistor T2 controls a data current flowing from the driving power line PL to the light emitting diode chip 300 based on a data signal supplied from the switching thin film transistor T1, thereby allowing the light emitting diode chip 300 to emit light at a brightness proportional to the data signal.

The capacitor Cst is provided in an overlap area between the gate electrode N1 and the source electrode of the driving thin film transistor T2, stores a voltage corresponding to the data signal supplied to the gate electrode of the driving thin film transistor T2, and turns on the driving thin film transistor T2 at the stored voltage.

Each of the plurality of light emitting diode chips 300 is electrically connected between the pixel circuit PC of the corresponding pixel SP and the common power line CL to emit light at brightness proportional to the current flowing from the pixel circuit PC, that is, the driving thin film transistor T2 to the common power line CL. The light emitting diode chip 300 according to one example emits any one of red light, green light, blue light and white light. Also, the light emitting diode chip 300 may be a micro light emitting diode chip. In this case, the micro light emitting diode chip may have, but not limited to, a scale of 1 to 100 micrometers. The micro light emitting diode chip may have a size smaller than that of the other light emitting area except that the area occupied by the pixel circuit PC in the pixel area. A structure of the light emitting diode chip 300 will be described later.

The second substrate 500 is arranged to cover the first substrate 100, and may be defined as an opposing substrate, a color filter array substrate, or an encapsulation substrate. The second substrate 500 may be bonded to the first substrate 100 by a sealant surrounding the display area AA of the first substrate 100.

Additionally, the light emitting diode display apparatus according to one example of the present disclosure further includes a gate driving circuit 700, and a panel driver 900.

The gate driving circuit 700 generates a gate pulse in accordance with a gate signal input from the panel driver 900 and supplies the generated gate pulse to the gate line. The gate driving circuit 700 according to one example is built in the third non-display area of the first substrate 100 by the same process as that of the thin film transistor provided in each pixel SP. For example, the gate driving circuit 700 may be provided in, but not limited to, the non-display area at a left side and/or right side of the display area AA. The gate driving circuit 700 may be provided in a random non-display area that may supply a gate pulse to the gate line.

Selectively, the gate driving circuit 700 may be manufactured in the form of a driving integrated circuit. In this case, the gate driving circuit 700 according to one example may be packaged in the third and/or fourth non-display area of the first substrate 100 to be connected with the plurality of gate lines one to one. The gate driving circuit 700 according to another example may be packaged in a gate flexible circuit film. In this case, the gate flexible circuit film may be attached to a gate pad portion provided in the third and/or fourth non-display area of the first substrate 100, whereby the gate driving circuit 700 may be connected to the plurality of gate lines through the gate flexible circuit film and the gate pad portion one to one.

The panel driver 900 is connected to the pad portion provided in the first non-display area of the first substrate 100 and displays an image corresponding to image data supplied from a display driving system on the display area AA. The panel driver 900 according to one example includes a plurality of data flexible circuit films 910, a plurality of data driving integrated circuits 930, a printed circuit board 950, a timing controller 970, and a power circuit 990.

Each of the plurality of data flexible circuit films 910 is attached to the pad portion of the first substrate 100 by a film attachment process.

Each of the plurality of data driving integrated circuits 930 is individually packaged in each of the plurality of data flexible circuit films 910. The data driving integrated circuit 930 receives pixel data and data control signal provided from the timing controller 970, converts the pixel data to an analog type data voltage per pixel in accordance with the data control signal, and supplies the converted data voltage to the corresponding data line DL.

The printed circuit board 950 is connected with the plurality of data flexible circuit films 910. The printed circuit board 950 supports the timing controller 970 and the power circuit 990, and serves to deliver a signal and a power source between elements of the panel driver 900.

The timing controller 970 is packaged in the printed circuit board 950, and receives image data and a timing synchronization signal provided from the display driving system through a user connector provided in the printed circuit board 950. The timing controller 970 generates pixel data by aligning the image data to be suitable for a pixel arrangement structure of the display area AA based on the timing synchronization signal, and provides the generated pixel data to the data driving integrated circuit 930. Also, the timing controller 970 controls each driving timing of the plurality of data driving integrated circuits 930 and the gate driving circuits 700 by generating each of the data control signal and the gate control signal on the basis of the timing synchronization signal.

The power circuit 990 is packaged in the printed circuit board 950, generates various voltages required to display an image on the display area AA by using externally input power source and supplies the generated voltages to the corresponding element.

Additionally, the panel driver 900 may further include a control board connected to the printed circuit board 950. In this case, the timing controller 970 and the power circuit 990 are packaged in the control board without being packaged in the printed circuit board 950. Therefore, the printed circuit board 950 serves to deliver a signal and a power source between the plurality of data flexible circuit films 910 and the control board.

Figure 3:
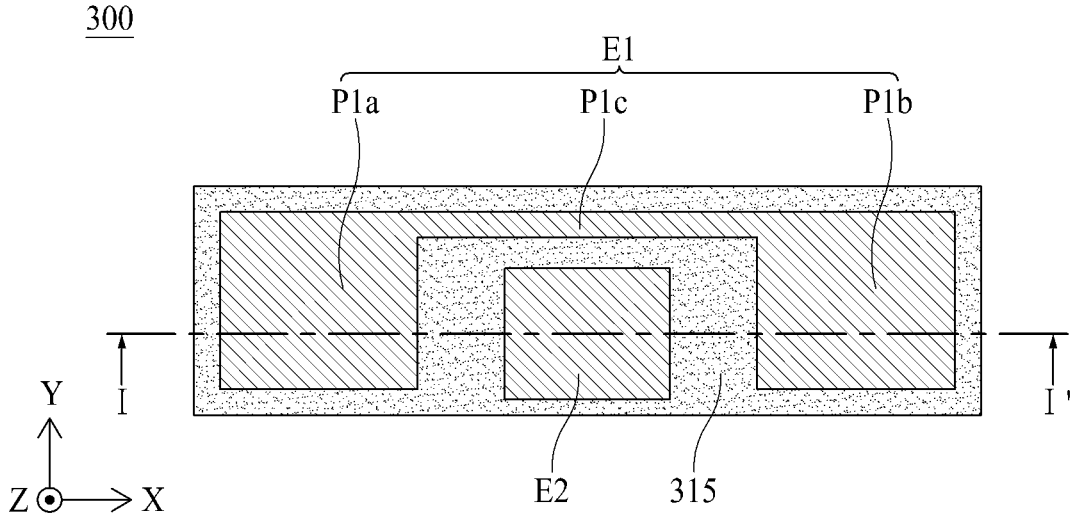
FIG. 3 is a plan view illustrating a light emitting diode chip according to the present disclosure.
Figure 4:
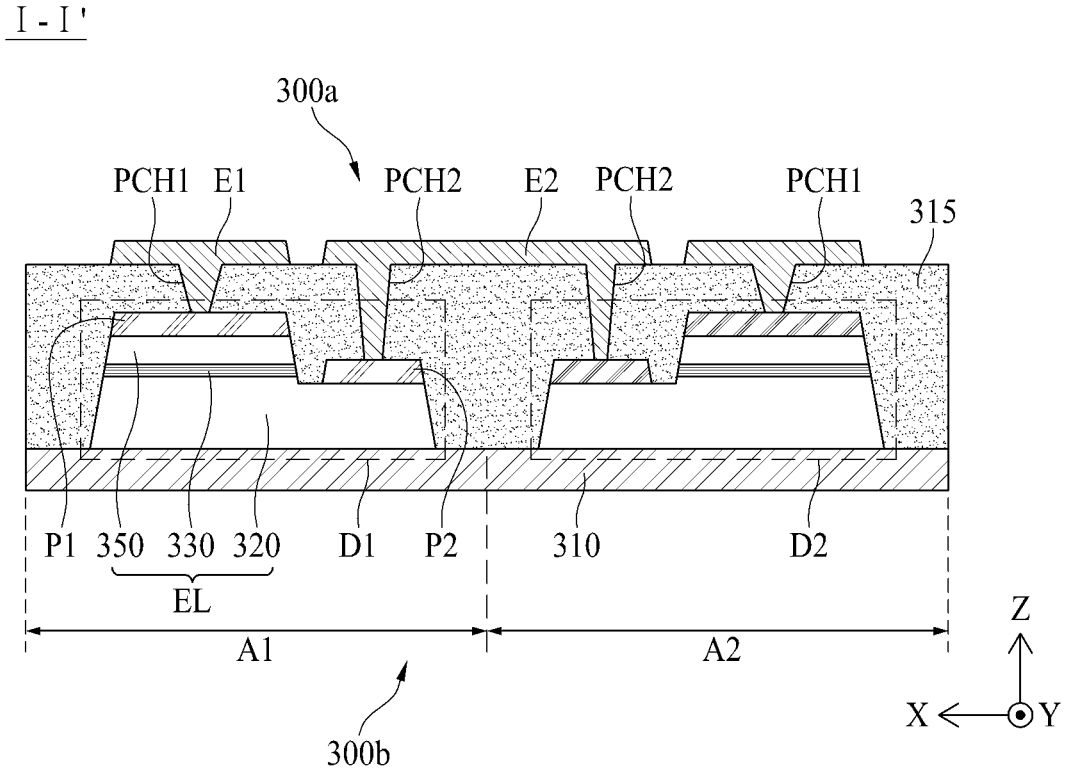
FIG. 4 is a side view illustrating a light emitting diode chip according to the present disclosure.

FIG. 3 is a plane view illustrating a light emitting diode chip shown in FIG. 2, and FIG. 4 is a cross-sectional view taken along line I-I' shown in FIG. 3.

Referring to FIGS. 3 and 4, the light emitting diode chip 300 according to this example includes a semiconductor substrate 310, a first light emitting diode D1, a second light emitting diode D2, an insulating layer 315, a first electrode E1, and a second electrode E2.

The semiconductor substrate 310 is used as a substrate for manufacture of each of the first light emitting diode D1 and the second light emitting diode D2. The semiconductor substrate 310 includes a first area A1 provided with the first light emitting diode D1, and a second area A2 provided with the second light emitting diode D2. The semiconductor substrate 310 according to one example may include a semiconductor material such as a sapphire substrate or a silicon substrate. The semiconductor substrate 310 has uniform light transmittance.

The first light emitting diode D1 is provided on the first area A1 of the semiconductor substrate 310. The first light emitting diode D1 according to one example includes an emission layer EL, a first pad P1, and a second pad P2.

The emission layer EL emits light in accordance with recombination of electrons and holes according to a current flowing between the first pad P1 and the second pad P2. The emission layer EL according to one example includes a first semiconductor layer 320, an active layer 330, and a second semiconductor layer 350.

The first semiconductor layer 320 provides electrons to the active layer 330. The first semiconductor layer 320 according to one example may be made of an n-GaN based semiconductor material, of which example may include GaN, AlGaN, InGaN, or AlInGaN. In this case, Si, Ge, Se, Te or C may be used as an impurity used for doping of the first semiconductor layer 320.

The active layer 330 is provided on one side of the first semiconductor layer 320. The active layer 330 has a multi quantum well (MQW) structure having a well layer and a barrier layer having a band gap higher than that of the well layer. The active layer 330 according to one example may have a multi quantum well structure of InGaN/GaN.

The second semiconductor layer 350 is provided on the active layer 330, and provides holes to the active layer 330. The second semiconductor layer 350 according to one example may be made of a p-GaN based semiconductor material, of which example may include GaN, AlGaN, InGaN, or AlInGaN. In this case, Mg, Zn, or Be may be used as an impurity used for doping of the second semiconductor layer 350.

The first pad P1 is provided on the second semiconductor layer 350. The first pad P1 according to one example may be used as an anode electrode of the first light emitting diode D1 that provides holes to the second semiconductor layer 350. The first pad P1 is electrically connected with the first electrode E1.

The second pad P2 is provided on the other side of the first semiconductor layer 320 to be electrically isolated from the active layer 330 and the second semiconductor layer 350. The second pad P2 according to one example may be used as a cathode electrode of the first light emitting diode D1 that provides electrons to the first semiconductor layer 320. The second pad P2 is electrically connected with the second electrode E2.

Each of the first and second pads P1 and P2 according to one example may be made of a conductive transparent material or a conductive reflective material in accordance with a light emission direction of the light emitting diode chip 300. As an example, the conductive transparent material may be, but not limited to, ITO (Indium Tin Oxide) or IZO (Indium Zinc Oxide). The conductive reflective material may be made of, but not limited to, a material that includes one or more of a metal material such as Au, W, Pt, Si, Ir, Ag, Cu, Ni, Ti, or Cr, and its alloy. For example, if light emitted to the light emitting diode chip 300 advances to the semiconductor substrate 310, each of the first and second pads P1 and P2 may be made of a conductive reflective material, and if light emitted to the light emitting diode chip 300 advances to an opposite direction of the semiconductor substrate 310, each of the first and second pads P1 and P2 may be made of a conductive transparent material.

The second light emitting diode D2 is provided on the second area A2 of the semiconductor substrate 310 to be parallel with the first light emitting diode D1. The second light emitting diode D2 according to one example includes an emission layer EL, a first pad P1, and a second pad P2. Since the second light emitting diode D2 having this structure is formed in the same structure as that of the first light emitting diode D1 by the same process as that of the first light emitting diode D1, its detailed description will be omitted.

The insulating layer 315 is provided on the semiconductor substrate 310 to cover the first and second light emitting diodes D1 and D2. That is, the insulating layer 315 is provided on the semiconductor substrate 310 to surround a front surface and a side of each of the first and second light emitting diodes D1 and D2, thereby electrically insulating the first and second light emitting diodes D1 and D2 from each other and preventing damage from external impact from occurring. The insulating layer 315 according to one example may be made of an inorganic material such as SiOx and SiNx, or may be made of an organic material such as benzocyclobutene or photo acryl.

The first electrode E1 is provided on the insulating layer 315, and is commonly connected to the first pad P1 of each of the first and second light emitting diodes D1 and D2. That is, the first electrode E1 is commonly connected to the first pad P1 of each of the first and second light emitting diodes D1 and D2 through a first pad contact hole PCH1 provided in the insulating layer 315 to overlap each of the first pad P1 of the first light emitting diode D1 and the first pad P1 of the second light emitting diode D2. This first electrode E1 is commonly connected to the first pad P1 of each of the first and second light emitting diodes D1 and D2 by bypassing the second electrode E2 on the insulating layer 315, whereby the first pads P1 of the first and second light emitting diodes D1 and D2 are connected with each other in parallel.

The first electrode E1 according to one example may include a first connection electrode P1a, a second connection electrode P1b, and a bridge electrode P1c.

The first connection electrode P1a is provided in the insulating layer 315 on the first area A1 defined in the semiconductor substrate 310, and is connected to the first pad P1 of the first light emitting diode D1 through the first pad contact hole PCH1.

The second connection electrode P1b is provided in the insulating layer 315 on the second area A2 defined in the semiconductor substrate 310, and is connected to the first pad P1 of the second light emitting diode D2 through the first pad contact hole PCH1. This second connection electrode P1b is provided in parallel with the first connection electrode P1a by interposing the bridge electrode P1c and the second electrode E2 on the insulating layer 315.

The bridge electrode P1c is provided on the insulating layer 315 between the first and second light emitting diodes D1 and D2, and electrically connects the first connection electrode P1a with the second connection electrode P1b.

The second electrode E2 is provided on the insulating layer 315, and is commonly connected to the second pad P2 of each of the first and second light emitting diodes D1 and D2. That is, the second electrode E2 is commonly connected to the second pad P2 of each of the first and second light emitting diodes D1 and D2 through a second pad contact hole PGH2 provided in the insulating layer 315 to overlap each of the second pad P2 of the first light emitting diode D1 and the second pad P2 of the second light emitting diode D2. For this reason, the second pads P2 of the first and second light emitting diodes D1 and D2 are connected with each other in parallel.

Each of the first and second electrodes E1 and E2 according to one example may be made of a conductive transparent material or a conductive reflective material in accordance with a light emission direction of the light emitting diode chip 300. As an example, the conductive transparent material may be, but not limited to, ITO (Indium Tin Oxide) or IZO (Indium Zinc Oxide). The conductive reflective material may be made of, but not limited to, a material that includes one or more of a metal material such as Au, W, Pt, Si, Ir, Ag, Cu, Ni, Ti, or Cr, and its alloy. For example, if light emitted to the light emitting diode chip 300 advances to the semiconductor substrate 310, each of the first and second electrodes E1 and E2 may be made of a conductive reflective material, and if light emitted to the light emitting diode chip 300 advances to an opposite direction of the semiconductor substrate 310, each of the first and second electrodes E1 and E2 may be made of a conductive transparent material.

The light emitting diode chip 300 according to one example has a first portion 300a having the first and second electrodes E1 and E2 and a second portion 300b corresponding to a rear surface of the semiconductor substrate 310. The light emitting diode chip 300 is packaged in each pixel area provided in the first substrate 100 by a chip packaging process and therefore electrically connected between the pixel circuit PC and the common power line CL. For example, the first electrode E1 of the light emitting diode chip 300 is electrically connected to the pixel circuit PC, that is, the source electrode of the driving thin film transistor T2, and the second electrode E2 of the light emitting diode chip 300 is electrically connected to the common power line CL.

Therefore, the light emitting diode chip 300 emits light by means of a data current supplied from the driving thin film transistor T2 of the corresponding pixel circuit PC.

The light emitting diode chip 300 according to one example has two light emitting diodes D1 and D2 electrically connected in parallel on the semiconductor substrate 310, whereby any one of the two light emitting diodes D1 and D2 may be used as a redundancy light emitting diode. Therefore, in this example, a defect of the light emitting diode chip may be minimized, and since the redundancy light emitting diode is not required to be additionally arranged in each pixel, a transfer process (or chip packaging process) time may be reduced, and mass production may be improved.

Figure 5:
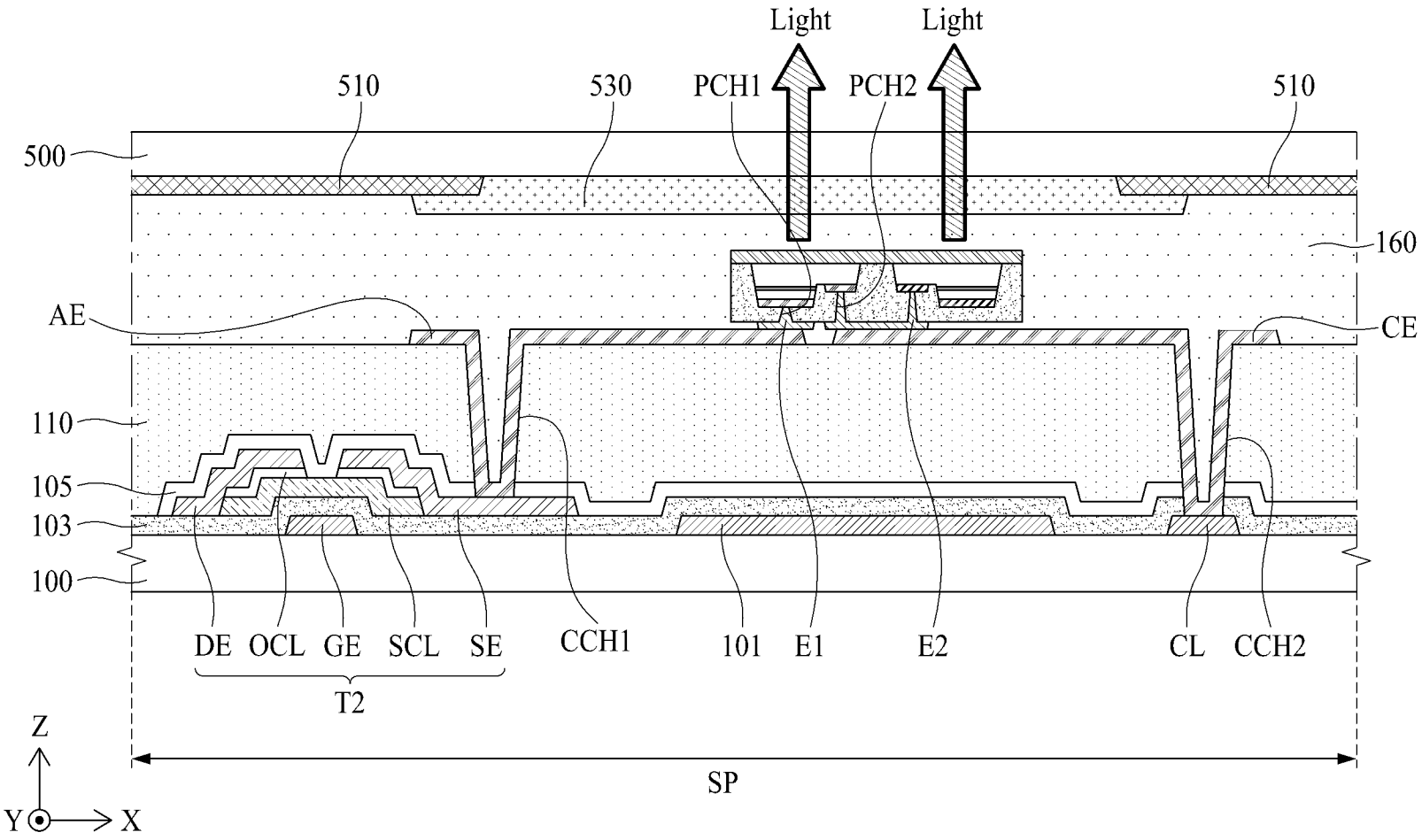
FIG. 5 is a view illustrating a connection structure in which a light emitting diode chip according to the present disclosure is transferred on a driving thin film transistor.

FIG. 5 is a view illustrating a connection structure in which a light emitting diode chip according to the present disclosure is transferred on a driving thin film transistor.

Referring to FIG. 5 together with FIG. 2, the light emitting diode display apparatus according to this example includes a plurality of pixels SP, a first planarization layer 110, a light emitting diode chip 300, a pixel electrode AE, and a common electrode CE.

Each of the plurality of pixels SP includes a pixel circuit PC that includes a driving thin film transistor T2 provided on the first substrate 100.

The driving thin film transistor T2 includes a gate electrode GE, a semiconductor layer SCL, an ohmic contact layer OCL, a source electrode SE, and a drain electrode DE.

The gate electrode GE is formed on the first substrate 100 together with the gate line GL. The gate electrode GE is covered by a gate insulating layer 103.

The gate insulating layer 103 may include a single layer or a plurality of layers made of an inorganic material such as SiOx, SiNx, etc.

The semiconductor layer SCL is provided on the gate insulating layer 103 in the form of a predetermined pattern (or island) to overlap the gate electrode GE. The semiconductor layer SCL may include a semiconductor material made of, but not limited to, any one of amorphous silicon, polycrystalline silicon, oxide and organic material.

The ohmic contact layer OCL is provided on the semiconductor layer SCL in the form of a predetermined pattern (or island). In this case, the ohmic contact layer PCL is intended for ohmic contact between the semiconductor layer SCL and source/drain electrodes SE and DE, and may be omitted.

The source electrode SE is formed on one side of the ohmic contact layer OCL to overlap one side of the semiconductor layer SCL. The source electrode SE is formed together with the data line DL and the driving power line PL.

The drain electrode DE is formed on the other side of the ohmic contact layer OCL to overlap the other side of the semiconductor layer SCL and to be spaced apart from the source electrode SE. The drain electrode DE is formed together with the source electrode SE, and is forked or protruded from its driving power line PL.

Additionally, the switching thin film transistor T1 constituting the pixel circuit PC is formed in the same structure as that of the driving thin film transistor T2. At this time, the gate electrode of the switching thin film transistor T1 is forked or protruded from the gate line GL, the first electrode of the switching thin film transistor T1 is forked or protruded from the data line DL, and the second electrode of the switching thin film transistor T1 is connected with the gate electrode GE of the driving thin film transistor T2 through a via hole provided in the gate insulating layer 103.

The pixel circuit PC may be covered by an inter-layer dielectric layer 105. The inter-layer dielectric layer 105 is provided on an entire surface of the first substrate 100 to cover the pixel circuit PC that includes the driving thin film transistor T2. The inter-layer dielectric layer 105 according to one example may be made of an inorganic material such as SiOx and SiNx, or may be made of an organic material such as benzocyclobutene or photo acryl. This inter-layer dielectric layer 105 may be omitted.

The first planarization layer (or passivation layer) 110 is provided on the entire surface of the first substrate 100 to cover the pixel SP, that is, the pixel circuit PC, or is provided on the entire surface of the first substrate 100 to cover the inter-layer dielectric layer 105. The first planarization layer 110 provides a planation surface on the inter-layer dielectric layer 105 while protecting the pixel circuit PC that includes the driving thin film transistor T2. The first planarization layer 110 according to one example may be made of an organic material such as benzocyclobutene or photo acryl but is preferably made of a photo acryl material for convenience of process.

The light emitting diode chip 300 is connected with the pixel circuit PC through a transfer mode. The light emitting diode chip 300 includes a first portion 300a having first and second electrodes E1 and E2 connected with the pixel circuit PC and a second portion 300b opposite to the first portion 300a. The light emitting diode chip 300 according to one example includes an emission layer EL, a first electrode E1, and a second electrode E2. Since the emission layer EL, the first electrode E1, and the second electrode E2 have been described, their detailed description will be omitted.

The pixel electrode AE is electrically connected to the first electrode E1 of the light emitting diode chip 300 and the driving thin film transistor T2, and may be defined as an anode electrode. The pixel electrode AE is provided on the first planarization layer 110 overlapping the driving thin film transistor T2 and the first electrode E1 of the light emitting diode chip 300. The pixel electrode AE is electrically connected to the source electrode SE of the driving thin film transistor T2 through a first circuit contact hole CCH1 provided to pass through the first planarization layer 110 and the inter-layer dielectric layer 105, and is electrically connected to the first electrode E1 of the light emitting diode chip 300. Therefore, the first electrode E1 of the light emitting diode chip 300 is electrically connected with the source electrode SE of the driving thin film transistor T2 through the pixel electrode AE. In this way, the pixel electrode AE may be made of a transparent conductive material if the light emitting diode display apparatus is a top emission type, and may be made of a light reflective conductive material if the light emitting diode display apparatus is a bottom emission type. In this case, the transparent conductive material may be, but not limited to, ITO (indium tin oxide) or IZO (indium zinc oxide). The conductive reflective material may be made of, but not limited to, Al, Ag, Au, Pt, or Cu. The pixel electrode AE made of the light reflective conductive material may be made of a single layer that includes a light reflective conductive material, or a multi-layer deposited with the single layer.

The first circuit contact hole CCH1 is provided in the first planarization layer 110 and the inter-layer dielectric layer 105 partially overlapping the source electrode SE of the driving thin film transistor T2 to partially expose the source electrode SE of the driving thin film transistor T2. The first circuit contact hole CCH1 may be provided as the first planarization layer 110 and the inter-layer dielectric layer 105 partially overlapping the source electrode SE of the driving thin film transistor T2 are removed by a hole patterning process based on a photolithography process and an etching process.

The common electrode CE is electrically connected to the second electrode E2 of the light emitting diode chip 300 and the common power line CL, and may be defined as a cathode electrode. The common electrode CE is provided on the first planarization layer 110 overlapping the common power line CL and the second electrode E2 of the light emitting diode chip 300. In this case, the common electrode CE may be made of the same material as that of the pixel electrode AE. The common electrode CE is electrically connected to the common power line CL through a second circuit contact hole CCH2 provided to pass through the gate insulating layer 103 and the inter-layer dielectric layer 105 and the first planarization layer 110, and is electrically connected to the second electrode E2 of the light emitting diode chip 300. Therefore, the second electrode E2 of the light emitting diode chip 300 is electrically connected with the common power line CL through the common electrode CE.

The second circuit contact hole CCH2 is provided in the first planarization layer 110, the inter-layer dielectric layer 105 and the gate insulating layer 103 partially overlapping the common power line CL to partially expose the common power line CL. The second circuit contact hole CCH2 may be provided as the first planarization layer 110, the inter-layer dielectric layer 105 and the gate insulating layer 103 partially overlapping the common power line CL are removed by a hole patterning process based on a photolithography process and an etching process.

The pixel electrode AE and the common electrode CE may be provided at the same time by a deposition process for depositing an electrode material on the first planarization layer 110, which includes the first and second circuit contact holes CCH1 and CCH2, and an electrode patterning process based on a photolithography process and an etching process.

The light emitting diode display apparatus according to one example further includes a second substrate 500.

The second substrate 500 is arranged to cover the other portion except the pad portion of the first substrate 100, thereby protecting a pixel array provided on the first substrate 100, and may be defined as a color filter array substrate, an opposing substrate, or an encapsulation substrate. For example, the second substrate 500 according to one example may be made of, but not limited to, a transparent glass material or a transparent plastic material.

The second substrate 500 according to one example includes a black matrix 510.

The black matrix 510 defines an opening area of each pixel SP provided in the first substrate 100. That is, the black matrix 510 is provided on the second substrate 500 overlapping the other light-shielding area except the opening area overlapping the light emitting diode chip 300 of each pixel SP, thereby preventing mixing of colors between adjacent opening areas from occurring. The black matrix 510 according to one example may include a plurality of first light-shielding patterns covering each of the plurality of gate lines GL, the plurality of common power lines CL and a pixel circuit PC of each pixel SP, a plurality of second light-shielding patterns covering each of the plurality of data lines DL and the plurality of driving power lines PL, and a third light-shielding pattern covering an edge portion of the second substrate 500. In this case, the first to third light-shielding patterns may be provided on the same layer, whereby the black matrix 510 may have a mesh type.

Additionally, the second substrate 500 may further include a light extraction layer 530 provided in the opening area defined by the black matrix 510. The light extraction layer 530 is made of a transparent material and serves to extract light emitted from the light emitting diode chip 300 to the outside. An opposing surface of the light extraction layer 530, which faces the light emitting diode chip 300, may have a lens type for increasing linearity of light emitted from the light emitting diode chip 300. The light extraction layer 530 serves to minimize a step difference between the black matrix 510 provided in the second substrate 500 and the opening area.

Meanwhile, if the light emitting diode chip 300 arranged in each pixel SP emits white light, the second substrate 500 includes a color filter layer 530 provided in the opening area instead of the light extraction layer 530.

The color filter layer 530 may include a red color filter, a green color filter and a blue color filter, which correspond to each color defined in each of the plurality of pixels SP. This color filter layer 530 transmits only light having a wavelength of a color corresponding to a corresponding pixel in white light emitted from the pixel SP.

The light emitting diode display apparatus according to this example further includes an encapsulation layer 160 covering the upper surface of the first substrate 100 that includes the pixel SP and the light emitting diode chip 300.

The encapsulation layer 160 is provided between the second substrate 500 and the first substrate 100 to cover the pixel SP and the light emitting diode chip 300. That is, the encapsulation layer 160 is coated on the first substrate 100 that includes the pixel SP and the light emitting diode chip 300, thereby protecting the pixel SP and the light emitting diode chip 300, which are provided in the first substrate 100. The encapsulation layer 160 according to one example may be, but not limited to, an optical clear adhesive (OCA) or an optical clear resin (OCR).

The encapsulation layer 160 according to one example may be made of heat and/or optical hardening resin, may be coated on the first substrate 100 in a liquid state and then hardened by a hardening process based on heat and/or light. At this time, the hardening process of the encapsulation layer 160 may be performed after a bonding process of the encapsulation layer 160 coated on the first substrate 100 and the second substrate 500. The encapsulation layer 160 serves to buffer a pressed power of the second substrate 500 during the bonding process of the first substrate 100 and the second substrate 500.

The light emitting diode display apparatus according to this example further includes a reflective layer 101 arranged between the first substrate 100 and the light emitting diode chip 300.

The reflective layer 101 is arranged between the gate insulating layer 103 and the first substrate 100 to overlap the light emitting diode chip 300. The reflective layer 101 according to one example may be made of the same material as that of the gate electrode GE of the driving thin film transistor T2, and may be provided on the same layer as the gate electrode GE. The reflective layer 101 reflects incident light from the light emitting diode chip 300 to the second substrate 500. Therefore, the light emitting diode display apparatus according to this example includes the reflective layer 101 and therefore has a top emission structure.

Selectively, the reflective layer 101 may be made of the same material as that of the source/drain electrodes SE/DE of the driving thin film transistor T2, and may be provided on the same layer as the source/drain electrodes SE/DE.

Since the pixel electrode AE connecting the light emitting diode chip 300 with the pixel circuit PC and the common electrode CE may be formed at the same time, the electrode connection process may be simplified, and a process time for connecting the light emitting diode chip 300 with the pixel circuit PC may be reduced remarkably, whereby productivity of the light emitting diode display apparatus may be improved.

Figure 6:
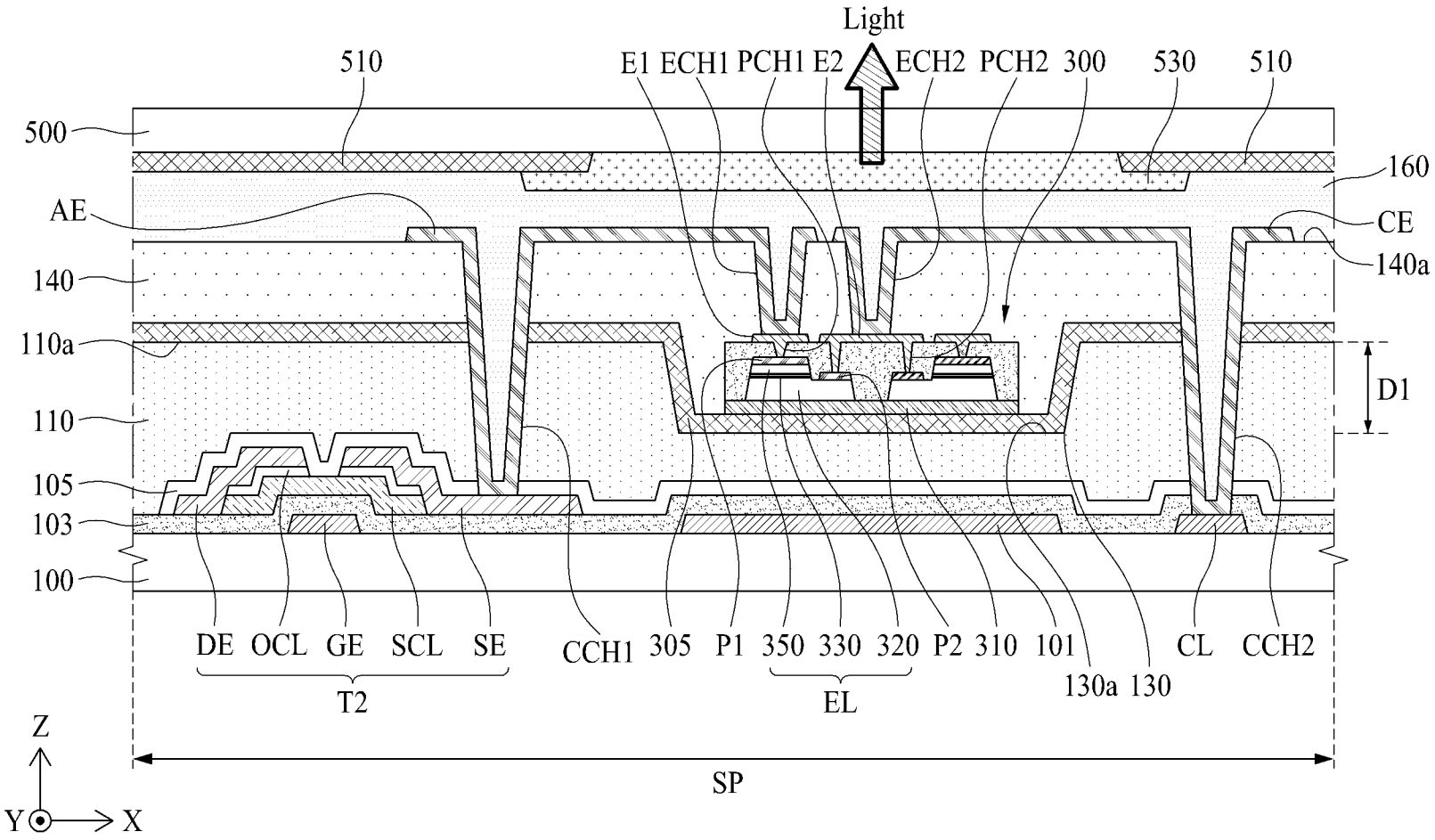
FIG. 6 is a cross-sectional view illustrating a connection structure of a driving thin film transistor and a light emitting diode chip in one pixel shown in FIG. 2.

FIG. 6 is a cross-sectional view illustrating a connection structure of a driving thin film transistor and a light emitting diode chip in one pixel shown in FIG. 2.

Referring to FIG. 6 together with FIG. 2, the light emitting diode display apparatus according to this example includes a plurality of pixels SP, a first planarization layer 110, a recessed portion 130, a light emitting diode chip 300, a second planarization layer 140, a pixel electrode AE, and a common electrode CE.

Since the plurality of pixels SP and the first planarization layer 110 are the same as those shown in FIG. 5, their repeated description will be omitted.

The recessed portion 130 is provided in an emission area defined by the pixel SP and receives the light emitting diode chip 300. In this case, the emission area of the pixel SP is defined to include the area overlapping the light emitting diode chip 300. In more detail, the emission area of the pixel SP may be defined as the other area except the circuit area provided with the pixel circuit PC in the pixel area.

The recessed portion 130 according to one example is recessed to have a certain depth D1 from the first planarization layer 110 provided on the first substrate 100 to cover the pixel circuit PC. At this time, the recessed portion 130 may be provided to be recessed from the upper surface 110a of the first planarization layer 110 to have a depth D1 corresponding to a thickness (or whole height) of the light emitting diode chip 300. In this case, the bottom 130a of the recessed portion 130 may be formed as a part of the first planarization layer 110 overlapping the emission area of the pixel SP to have the depth D1 set based on the thickness of the light emitting diode chip 300, the entire of the first planarization layer 110, the entire of the first planarization layer 110 and a part of the inter-layer dielectric layer 105, or the entire of the first planarization layer 110, the inter-layer dielectric layer 105 and the gate insulating layer 103 is removed. For example, the recessed portion 130 may be provided to have a depth of 2 to 6 micrometers from the upper surface 110a of the first planarization layer 110. The bottom surface 130a of the recessed portion 130 may have a grove or cup shape having a size greater than that of the second portion 300b of the light emitting diode chip 300.

The recessed portion 130 minimizes error alignment of the light emitting diode chip 300 during a transfer process of the light emitting diode chip by receiving the light emitting diode chip 300, thereby improving alignment accuracy. Moreover, thickness increase of the display apparatus according to the thickness (or height) of the light emitting diode chip 300 is minimized.

The recessed portion 130 supports the light emitting diode chip 300. At this time, the recessed portion 130 may support the light emitting diode chip 300 through an adhesive member 305.

The adhesive member 305 is interposed between the bottom surface 130a of the recessed portion 130 and the light emitting diode chip 300 and attaches the light emitting diode chip 300 to the bottom surface 130a of the recessed portion 130. The adhesive member 305 according to one example may be attached (or coated) to the second portion 300b of the light emitting diode chip 300, that is, the other side of the semiconductor substrate 310, whereby the adhesive member 305 may be attached to the bottom surface 130a of the recessed portion 130 during a packaging process of packaging the light emitting diode chip 300 in the recessed portion 130. The adhesive member 305 according to another example may be dotted on the bottom surface 130a of the recessed portion 130 and spread by a pressure applied during the packaging process of the light emitting diode chip 300, whereby the adhesive member 305 may be attached to the second portion 300b of the light emitting diode chip 300, that is, the other side of the semiconductor substrate 310. As a result, the light emitting diode chip 300 packaged in the recessed portion 130 may be fixed primarily by the adhesive member 305. Therefore, according to this example, the packaging process of the light emitting diode chip 300 is performed in such a manner that the light emitting diode chip 300 is simply attached to the bottom surface 130a of the recessed portion 130, whereby the time for the packaging process of the light emitting diode chip 300 may be reduced.

The packaging process of the light emitting diode chip 300 according to one example may further include a process of packaging a red light emitting diode chip in each of red pixels, a process of packaging a green light emitting diode chip in each of green pixels, a process of packaging a blue light emitting diode chip in each of blue pixels, a process of packaging a white light emitting diode chip in each of white pixels.

The packaging process of the light emitting diode chip 300 according to one example may include only a process of packaging a white light emitting diode chip in each of pixels. In this case, the first substrate 100 or the second substrate 500 includes a color filter layer overlapping each pixel. The color filter layer transmits only light having a wavelength of a color corresponding to a corresponding pixel of the white light.

The packaging process of the light emitting diode chip 300 according to one example may include only a process of packaging a light emitting diode chip of a first color in each of pixels. In this case, the first substrate 100 or the second substrate 500 includes a wavelength conversion layer, and a color filter layer overlapping each pixel. The wavelength conversion layer emits light of a second color based on a part of incident light from the light emitting diode chip of the first color. The color filter layer transmits only light having a wavelength of a color corresponding to a corresponding pixel of the white light according to a mixture of light of the first color and light of the second color. In this case, the first color may be a blue color, and the second color may be a yellow color.

The second planarization layer 140 is provided on the first planarization layer 110 to cover the light emitting diode chip 300. The second planarization layer 140 is provided on the entire surface of the first substrate 100 to cover the periphery and upper surface of the light emitting diode chip 300 arranged on the first planarization layer 110 and in the recessed portion 130. At this time, the second planarization layer 140 may be provided at a thickness for covering both the first electrode E1 and the second electrode E2 of the light emitting diode chip 300 arranged in the recessed portion 130 while embedding a peripheral space of the light emitting diode chip 300 arranged in the recessed portion 130. The second planarization layer 140 provides a planation surface on the first planarization layer 110. Also, the second planarization layer 140 serves to secondarily fix the light emitting diode chip 300 primarily fixed to the recessed portion 130 by the adhesive member 305 by embedding the peripheral space of the light emitting diode chip 300 arranged in the recessed portion 130.

The pixel electrode AE is electrically connected to the driving thin film transistor T2 and the first electrode E1 of the light emitting diode chip 300, and may be defined as an anode electrode. The pixel electrode AE is provided on the second planarization layer 140 overlapping the driving thin film transistor T2 and the first electrode E1 of the light emitting diode chip 300. The pixel electrode AE is electrically connected to the source electrode SE of the driving thin film transistor T2 through the first circuit contact hole CCH1 provided to pass through the inter-layer dielectric layer 105, the first planarization layer 110 and the second planarization layer 140, and is electrically connected to the first electrode E1 of the light emitting diode chip 300 through a first electrode contact hole ECH1 provided in the second planarization layer 140. Therefore, the first electrode E1 of the light emitting diode chip 300 is electrically connected with the source electrode SE of the driving thin film transistor T2 through the pixel electrode AE. In this way, the pixel electrode AE may be made of a transparent conductive material if the light emitting diode display apparatus is a top emission mode, and may be made of a light reflective conductive material if the light emitting diode display apparatus is a bottom emission type. In this case, the transparent conductive material may be, but not limited to, ITO (indium tin oxide) or IZO (indium zinc oxide). The conductive reflective material may be made of, but not limited to, Al, Ag, Au, Pt, or Cu. The pixel electrode AE made of the light reflective conductive material may be made of a single layer that includes a light reflective conductive material, or a multi-layer deposited with the single layer.

The first circuit contact hole CCH1 is provided in the first and second planarization layers 110 and 140 and the inter-layer dielectric layer 105 partially overlapping the source electrode SE of the driving thin film transistor T2 to partially expose the source electrode SE of the driving thin film transistor T2. The first circuit contact hole CCH1 may be provided as the first and second planarization layers 110 and 140 and the inter-layer dielectric layer 105 partially overlapping the source electrode SE of the driving thin film transistor T2 are removed by a hole patterning process based on a photolithography process and an etching process.

The first electrode contact hole ECH1 partially or fully exposes the first electrode E1 of the light emitting diode chip 300, and is provided together with the first circuit contact hole CCH1. The first electrode contact hole ECH1 may be provided as the second planarization layer 140 partially or fully overlapping the first electrode E1 of the light emitting diode chip 300 is removed by a hole patterning process based on a photolithography process and an etching process. In this case, since the first circuit contact hole CCH1 and the first electrode contact hole ECH1 have their respective depths different from each other, according to this example, a mask pattern may be formed on the second planarization layer 140 through a photolithography process based on a half tone mask, and the first circuit contact hole CCH1 and the first electrode contact hole ECH1 may be formed simultaneously through an etching process based on the mask pattern.

The common electrode CE is electrically connected to the second electrode E2 of the light emitting diode chip 300, and may be defined as a cathode electrode. The common electrode CE is provided on the second planarization layer 140 overlapping the common power line CL and the second electrode E2 of the light emitting diode chip 300. In this case, the common electrode CE may be made of the same material as that of the pixel electrode AE. The common electrode CE is electrically connected to the common power line CL through the second circuit contact hole CCH2 provided to pass through the gate insulating layer 103, the inter-layer dielectric layer 105, the first planarization layer 110 and the second planarization layer 140, and is electrically connected to the second electrode E2 of the light emitting diode chip 300 through the second electrode contact hole ECH2 provided in the second planarization layer 140. Therefore, the second electrode E2 of the light emitting diode chip 300 is electrically connected with the common power line CL through the common electrode CE.

The second circuit contact hole CCH2 is provided in the first and second planarization layers 110 and 140, the inter-layer dielectric layer 105 and the gate insulating layer 103 partially overlapping the common power line CL to partially expose the common power line CL. The second circuit contact hole CCH2 may be provided as the first and second planarization layers 110 and 140, the inter-layer dielectric layer 105 and the gate insulating layer 103 partially overlapping the common power line CL are removed by a hole patterning process based on a photolithography process and an etching process. The second circuit contact hole CCH2 is provided together with the first circuit contact hole CCH1 and the first electrode contact hole ECH1.

The second electrode contact hole ECH2 partially or fully exposes the second electrode E2 of the light emitting diode chip 300, and is provided together with the second circuit contact hole CCH2. The second electrode contact hole ECH2 may be provided as the second planarization layer 140 partially or fully overlapping the second electrode E2 of the light emitting diode chip 300 is removed by a hole patterning process based on a photolithography process and an etching process. In this case, since the second circuit contact hole CCH2 and the second electrode contact hole ECH2 may be provided by the same hole patterning process as that of the first circuit contact hole CCH1 and the first electrode contact hole ECH1.

The pixel electrode AE and the common electrode CE may be provided at the same time by a deposition process for depositing an electrode material on the second planarization layer 140, which includes the first and second electrode contact holes ECH1 and ECH2, and an electrode patterning process based on a photolithography process and an etching process. Therefore, according to this example, since the pixel electrode AE connecting the light emitting diode chip 300 with the pixel circuit PC and the common electrode CE may be formed at the same time, the electrode connection process may be simplified, and a process time for connecting the light emitting diode chip 300 with the pixel circuit PC may be reduced remarkably, whereby productivity of the light emitting diode display apparatus may be improved.

Figure 7:
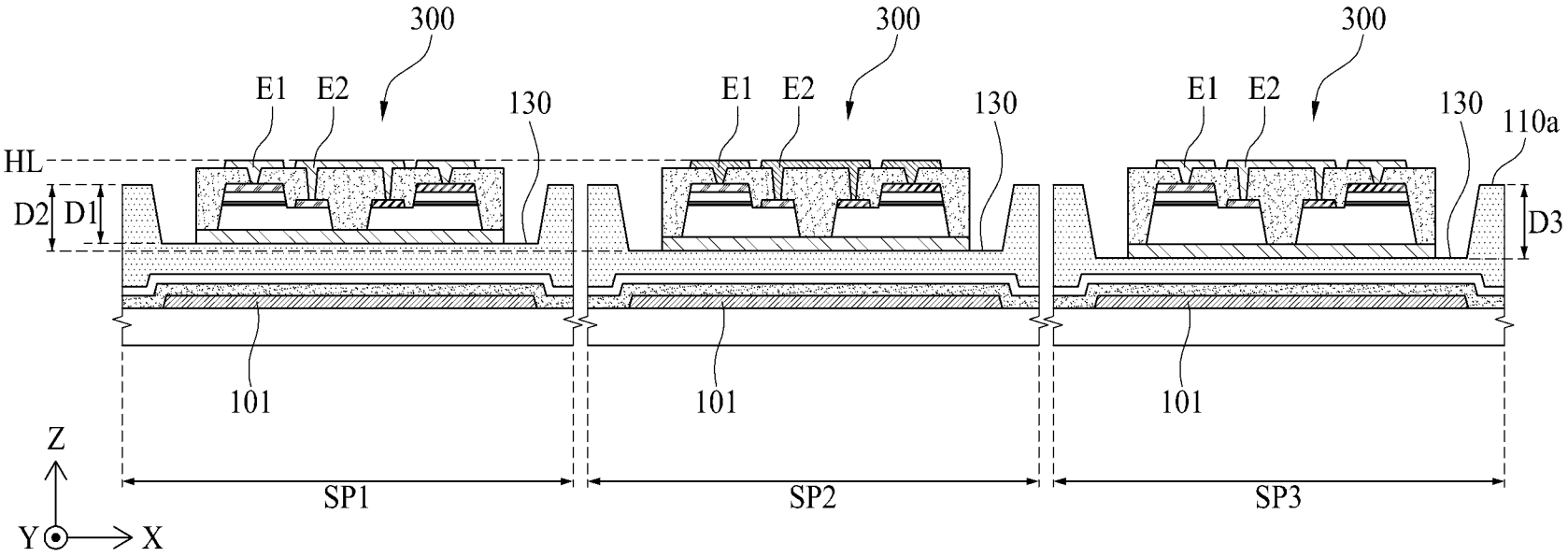
FIG. 7 is a view illustrating a modified example of a recessed portion shown in FIG. 6.

FIG. 7 is a view illustrating a modified example of a recessed portion shown in FIG. 6.

Referring to FIG. 7, the recessed portion 130 provided in each pixel SP in accordance with the modified example may be formed to be recessed from the first planarization layer 110 to have a different depth D1, D2 or D3 per pixel SP. In this case, the depth D1, D2 or D3 of the recessed portion 130 may be defined as the distance between the upper surface 110a of the first planarization layer 110 and the bottom surface 130a of each recessed portion 130.

The recessed portion 130 provided in each pixel SP may be provided at a depth D1, D2 or D3 different for each of at least three adjacent pixels SP1, SP2 and SP3 constituting one unit pixel UP. That is, the recessed portion 130 is provided at a different depth D1, D2, or D3 from the first planarization layer 110 based on a height of the light emitting diode chip 300 which will be arranged in the corresponding pixel, whereby a height deviation (or step difference) between light emitting diode chips per color is removed or minimized.

The light emitting diode display apparatus according to this example includes a red pixel SP1, a green pixel SP2, and a blue pixel SP3 to realize a color image, and the light emitting diode chip 300 is arranged in the recessed portion 130 classified per color and provided in a pixel of a corresponding color. At this time, the light emitting diode chip per color may have a different height (or thickness) by means of a process error, etc. during a manufacturing process. For example, the light emitting diode chip per color may be thicker in the order of red, green and blue. In this case, the depth D1, D2 or D3 of the recessed portion 130 may be provided to be deeper in the order of the red pixel SP1, the green pixel SP2 and the blue pixel SP3 based on the height of the corresponding light emitting diode chip 300.

Therefore, the depth of the recessed portion 130 provided in each pixel is set differently on the basis of the height (or thickness) of the light emitting diode chip 300 which will be arranged in the pixel, whereby the uppermost surface of the light emitting diode chip 300 arranged in each pixel, for example, the upper surface of the first electrode E1 may be arranged on the same horizontal line HL. As a result, an open defect may be avoided, in which the first electrode (or the second electrode) of the light emitting diode chip 300 is not exposed due to thickness deviation of the light emitting diode chip per color during the patterning process of the first and second electrode contact holes. Also, in this example, in the top emission structure, an optical distance between the light emitting diode chip 300 of each pixel and the reflective layer 101 is optimized through the recessed portion 130 provided at a different depth D1, D2 or D3 for each pixel, whereby reflective efficiency of the reflective layer 101 may be improved. As a result, optical efficiency of the light emitting diode chip 300 can be maximized.

According to the present disclosure, the following advantage may be obtained.

In the light emitting diode chip and the light emitting diode display apparatus according to the present disclosure, a transfer time is shorter than that of the redundancy mode and a pixel defect may not be generated, thereby productivity of the light emitting diode display apparatus can be ensured.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A light emitting diode display apparatus comprising:

[a pixel including] a driving thin film transistor on a substrate;

a first planarization layer [covering the pixel] *on the driving thin film transistor*;

a light emitting diode chip [having first and second electrodes] *including a first light emitting diode and a second light emitting diode, wherein each of the first and second light emitting diodes includes a first pad and a second pad*;

a second planarization layer covering the first planarization layer and the light emitting diode chip;

a pixel electrode provided on the second planarization layer and electrically connected with the driving thin film transistor and the first [electrode] *pad* of *each of* the [light emitting diode chip] *first and second light emitting diodes*; and a common electrode provided on the second planarization layer and electrically connected to the second [electrode] *pad* of *each of* the [light emitting diode chip, wherein the light emitting diode chip includes first and second light emitting diodes provided on a semiconductor substrate in parallel] *first and second light emitting diodes*.

2. The light emitting diode display apparatus of claim 1, wherein each of the first and second light emitting diodes *further* includes:

a first semiconductor layer[on the semiconductor substrate];

an active layer on the first semiconductor layer; *and* a second semiconductor layer on the active layer[;],

[a] *wherein the* first pad *is disposed* on the second semiconductor layer[;], and

[a] *wherein the* second pad *is disposed* on the first semiconductor layer.

3. The light emitting diode display apparatus of claim 2, wherein the light emitting diode chip further includes an insulating layer covering the first and second light emitting diodes, the [first] *pixel* electrode is commonly connected to the first pad of each of the first and second light emitting diodes through a first pad contact hole in the insulating layer, and the [second] *common* electrode is commonly connected to the second pad [through] *of* each of the first and second light emitting diodes through a second pad contact hole in the insulating layer.

4. The light emitting diode display apparatus of claim 1, further comprising a common power line provided on the substrate, wherein the pixel electrode is provided on an upper surface of the first planarization layer[and electrically connected to the driving thin film transistor and the first electrode of the light emitting diode chip], and the common electrode is provided on [the upper surface of] the first planarization layer and electrically connected to the common power line[and the second electrode of the light emitting diode chip].

5. The light emitting diode display apparatus of claim 1, further comprising a common power line provided on the substrate, wherein the pixel electrode is provided on an upper surface of the second planarization layer[and electrically connected to the driving thin film transistor and the first electrode of the light emitting diode chip], and

*wherein* the common electrode is provided on the upper surface of the second planarization layer and electrically connected to the common power line[and the second electrode of the light emitting diode chip].

6. The light emitting diode display apparatus of claim 1, further comprising a recessed portion provided on *or in* the first planarization layer, receiving the light emitting diode chip[; and a unit pixel having at least three pixels arranged to adjacent to one another, wherein the recessed portion is provided at a depth different for each of the pixels constituting the unit pixel].

7. The light emitting diode display apparatus of claim 1, further comprising a reflective layer disposed between the substrate and the [first] light emitting diode chip.

8. A light emitting diode display device comprising:

[a first pixel including] a first driving thin film transistor *in a first pixel* on a substrate;

a first planarization layer[covering the first pixel];

a first light emitting diode chip disposed in the first planarization layer and including first and second light emitting diodes[electrically connected with each other in parallel, each of the first and second light emitting diodes having first and second electrodes];

*a first electrode electrically connected to the first and second light emitting diodes;*

*a second electrode electrically connected to the first and second light emitting diodes;* a pixel electrode electrically connecting the *first* driving thin film transistor and the first electrode[of the first light emitting diode chip]; and a common electrode electrically connected to the second electrode[of the first light emitting diode chip], wherein each of the first and second light emitting diodes [comprise] *comprises*:

a first semiconductor layer on the substrate;

an active layer on the first semiconductor layer;

a second semiconductor layer on the active layer;

a first pad on the second semiconductor layer; and a second pad on the first semiconductor layer, wherein the first light emitting diode chip further includes an insulating layer covering *at least a part of* the first and second light emitting diodes, and wherein the first electrode is commonly connected to the first pad of each of the first and second light emitting diodes through a first pad contact hole in the insulating layer, and the second electrode is commonly connected to the second pad [through] *of* each of the first and second light emitting diodes through a second pad contact hole in the insulating layer.

9. The light emitting diode display device of claim 8, further comprising [second pixel adjacent to the first pixel and having] a second light emitting diode chip disposed in the first planarization layer[, and a top surface of the first light emitting diode chip in horizontally in line with a top surface of the second light emitting diode chip] *in a second pixel adjacent to the first pixel*.

10. The light emitting diode display [apparatus] *device* of claim 9, wherein:

the first light emitting diode chip is disposed in a first recessed portion of the first planarization layer*, and* the second light emitting diode chip is disposed in a second recessed portion of the first planarization layer[, the first and second recessed portion have a depth different from each other].

11. The light emitting diode display [apparatus] *device* of claim 8, further comprising a common power line provided on the substrate, wherein the pixel electrode is disposed on an upper surface of the first planarization layer and electrically connected to the first driving thin film transistor and the first electrode of the first light emitting diode chip, and the common electrode is provided on [the upper surface of] the first planarization layer and electrically connected to the common power line and the second electrode of the first light emitting diode chip.

12. The light emitting diode display [apparatus] *device* of claim 11, further comprising:

a second planarization layer covering the first planarization layer and the first light emitting diode chip, wherein each of the pixel electrode and the common electrode is provided on the second planarization layer.

13. The light emitting diode display [apparatus] *device* of claim 8, further comprising *a* second pixel adjacent to the first pixel and having a second light emitting diode chip disposed in the first planarization layer;

a second planarization layer covering the first planarization layer, the first light emitting diode chip and the second light emitting diode chip; and a common power line provided on the substrate, wherein the second light emitting diode chip includes first and second light emitting diodes having first and second electrodes and electrically connected with each other in parallel, and wherein the common electrode is further provided on the upper surface of the second planarization layer and further electrically connected to the common power line and the second electrode of the second light emitting diode chip.

14. The light emitting diode display [apparatus] *device* of claim 8, further comprising a reflective layer disposed between the substrate and the light emitting diode chip.

*15. The light emitting diode display apparatus of claim 1, wherein the light emitting diode chip is configured to emit one of a red light, a green light, a blue light, and a white light.*

*16. The light emitting diode display apparatus of claim 2, wherein the first semiconductor layer comprises an n-GaN based semiconductor material.*

*17. The light emitting diode display apparatus of claim 16, wherein the n-GaN based semiconductor material comprises at least one of GaN, AlGaN, InGaN, AlInGaN, Si, Ge, Se, Te, and C.*

*18. The light emitting diode display apparatus of claim 2, wherein the second semiconductor layer comprises a p-GaN based semiconductor material.*

*19. The light emitting diode display apparatus of claim 18, wherein the p-GaN based semiconductor material comprises one of GaN, AlGaN, InGaN, AlInGaN, Mg, Zn, and Be.*

*20. The light emitting diode display apparatus of claim 2, wherein the active layer has a multi quantum well structure comprising a well layer and a barrier layer, and*

*wherein the barrier layer has a band gap higher than that of the well layer.*

*21. The light emitting diode display apparatus of claim 2, wherein the second pad is electrically isolated from the active layer and the second semiconductor layer.*

*22. The light emitting diode display apparatus of claim 1, wherein the first pad and/or the second pad comprises a conductive transparent material or a conductive reflective material.*

*23. The light emitting diode display apparatus of claim 22, wherein the conductive transparent material comprises ITO or IZO.*

*24. The light emitting diode display apparatus of claim 22, wherein the conductive reflective material comprises one of Au, W, Pt, Si, Ir, Ag, Cu, Ni, Ti, and Cr.*

*25. The light emitting diode display apparatus of claim 1, wherein one of the first and second light emitting diodes serves as a redundancy light emitting diode.*

*26. The light emitting diode display apparatus of claim 1, wherein the first planarization layer comprises benzocyclobutene or photo acryl.*

*27. The light emitting diode display apparatus of claim 1, wherein the pixel electrode overlaps with the driving thin film transistor.*

*28. The light emitting diode display apparatus of claim 1, wherein the pixel electrode is electrically connected to the driving thin film transistor through a contact hole that passes through the first and second planarization layers.*

*29. The light emitting diode display apparatus of claim 1, wherein at least one of the pixel electrode and the common electrode comprises ITO or IZO.*

*30. The light emitting diode display apparatus of claim 1, further comprising a light extraction layer or a color filter layer disposed on the light emitting diode chip.*

*31. The light emitting diode display apparatus of claim 30, wherein the light extraction layer is configured to extract light emitted from the light emitting diode chip.*

*32. The light emitting diode display apparatus of claim 1, further comprising a wavelength conversion layer.*

*33. The light emitting diode display apparatus of claim 4, wherein the common power line is in parallel with a gate line.*

*34. The light emitting diode display apparatus of claim 6, further comprising a unit pixel having at least three pixels arranged to adjacent to one another, wherein the recessed portion is provided at a depth different for each of the pixels constituting the unit pixel.*

*35. The light emitting diode display apparatus of claim 6, wherein a bottom surface of the light emitting diode chip is in a direct contact with a layer different from the first planarization layer.*

*36. The light emitting diode display apparatus of claim 6, wherein the first planarization layer comprises a groove formed throughout a depth direction of the first planarization layer, and*

*wherein the groove comprises the recessed portion.*

*37. The light emitting diode display device of claim 8, wherein the first and second light emitting diodes are electrically connected with each other in parallel.*

*38. The light emitting diode display device of claim 8, wherein the first electrode and the pixel electrode are made of a same material.*

*39. The light emitting diode display device of claim 38, wherein the first electrode and the pixel electrode are made of ITO or IZO.*

*40. The light emitting diode display device of claim 8, wherein the second electrode and the common electrode are made of a same material.*

*41. The light emitting diode display device of claim 40, wherein the second electrode and the common electrode are made of ITO or IZO.*

*42. The light emitting diode display device of claim 9, wherein the first light emitting diode chip has a height different from a height of the second light emitting diode chip.*

*43. The light emitting diode display device of claim 9, wherein a top surface of the first light emitting diode chip is horizontally in line with a top surface of the second light emitting diode chip.*

*44. The light emitting diode display device of claim 10, wherein the first and second recessed portions have a depth different from each other.*

*45. The light emitting diode display device of claim 8, further comprising a gate driving circuit configured to:*

*generate a gate pulse based on a gate signal from a panel driver; and*

*transmit the generated gate pulse to a gate line.*

*46. The light emitting diode display device of claim 45, further comprising a display area including the first pixel and a non-display area,*

*wherein the gate driving circuit is disposed in a first portion of the non-display area and formed by a process that is the same as a process of forming the first driving thin film transistor.*

*47. The light emitting diode display device of claim 46, wherein the first portion of the non-display area is located at a left side or a right side of the display area.*

*48. The light emitting diode display device of claim 46, wherein the panel driver is connected to a second portion of the non-display area and configured to display an image on the display area, and*

*wherein the image corresponds to image data transmitted from a display driving system.*

*49. The light emitting diode display device of claim 8, wherein the first electrode comprises:*

*a first connection electrode;*

*a second connection electrode; and*

*a bridge electrode extending, within the first pixel, from the first connection electrode to the second connection electrode,*

*wherein the first connection electrode, the second connection electrode, and the bridge electrode are disposed on a same plane.*

*50. The light emitting diode display device of claim 49, wherein at least a portion of the second electrode is disposed between the first connection electrode and the second connection electrode.*

* * * * *